United States Patent [19]

Haluska et al.

[11] Patent Number: 5,336,532
[45] Date of Patent: Aug. 9, 1994

[54] LOW TEMPERATURE PROCESS FOR THE FORMATION OF CERAMIC COATINGS

[75] Inventors: Loren A. Haluska; Keith W. Michael, both of Midland, Mich.

[73] Assignee: Dow Corning Corporation, Midland, Mich.

[21] Appl. No.: 312,457

[22] Filed: Feb. 21, 1989

[51] Int. Cl.$^5$ .............................................. B05D 5/00
[52] U.S. Cl. .................................. 427/515; 427/527; 427/567
[58] Field of Search .................. 428/702; 427/38, 515, 427/527, 567

[56] References Cited

U.S. PATENT DOCUMENTS

| | | | |
|---|---|---|---|
| 4,472,510 | 9/1984 | January | 428/428 X |
| 4,753,855 | 6/1988 | Haluska et al. | 428/702 |
| 4,756,977 | 7/1988 | Haluska et al. | 428/704 |
| 4,808,653 | 2/1989 | Haluska et al. | 524/398 |
| 4,822,697 | 4/1989 | Haluska et al. | 428/698 |

FOREIGN PATENT DOCUMENTS 63-289939  11/1988  Japan .

OTHER PUBLICATIONS

Spialter et al, "On The Mechanism of the Reaction of Ozone with the Silicon-Hydrogen Bond", J. Am. Chem. Soc. 93:22, (1971).

Primary Examiner—Peter A. Nelson
Attorney, Agent, or Firm—Killworth, Gottman, Hagan & Schaeff

[57] ABSTRACT

A single or multilayer ceramic or ceramic-like coating process is provided which can be applied to heat sensitive substrates such as electronic devices. The process includes the steps of coating the substrate with a solution comprising a hydrogen silsesquioxane resin diluted in a solvent and then evaporating the solvent, thereby depositing a preceramic coating on the substrate. The preceramic coating is then ceramified to a silicon dioxide-containing ceramic by heating the preceramic coating to a temperature of between about 40° to about 400° C. in the presence of ozone which enhances the rate at which the ceramification proceeds and permits the ceramification of the coating to proceed at low temperatures. Additional layers of ceramic materials may be deposited over the initial layer and act as passivating and/or barrier protective layers.

39 Claims, No Drawings

LOW TEMPERATURE PROCESS FOR THE FORMATION OF CERAMIC COATINGS

BACKGROUND OF THE INVENTION

This invention relates to ceramic or ceramic-like coatings and methods of coating substrates, and more particularly to the low temperature formation of monolayer and multilayer ceramic or ceramic-like coatings.

It is desirable for electronic circuits and devices and other nonmetallic substrate materials to be serviceable under a range of environmental conditions. Further, many of the uses for electronic devices today places a premium on size and weight. For example, electronic circuits used in spacecraft, satellites, and aircraft need not only to be able to withstand a wide variety of environmental conditions, but also must be compact and lightweight in use. In order to protect such devices and substrates from heat, moisture, and abrasive forces, the art has resorted to a number of methods to coat the devices and substrates to prevent, or at least minimize, the exposure of the devices or substrates to these environmental conditions.

Early attempts at protecting electronic circuitry included potting the circuits in polymeric resins. However, these techniques added considerable thickness and weight to the circuits. Also, the polymeric coatings tended to absorb moisture from the environment which could eventually lead to damage or failure of the circuits. Presently, some circuits are contained in ceramic packages to protect them from environmental exposure. While the ceramic packages are relatively secure, they add a substantial amount of thickness and weight to the circuit. Further, they are relatively expensive to fabricate as the package typically must be evacuated of air, the device inserted, and then the package sealed.

Common causes for the failure of electronic devices include the formation of microcracks or voids in the surface passivation of the device, such as a semiconductor chip, permitting the introduction of impurities from the environment. For example, sodium (Na+) and chloride (Cl−) ions may enter electronic devices and disrupt the transmission of electrical signals. Additionally, the presence of moisture and/or volatile organic chemicals may also adversely affect the performance of electronic devices. A single coating material or layer may be insufficient to meet the ever increasing demands placed on the material by the electronics industry. Several coating properties such as microhardness, moisture resistance, ion barrier, adhesion, ductility, tensile strength, and thermal expansion coefficient matching must be achieved through the use of a number of thin protective layers on the electronic device.

More recently, lightweight monolayer and multilayer ceramic coatings have been developed for coating electronic devices. For example, Haluska et al, in U.S. Pat. Nos. 4,753,855 and 4,756,977, teach the formation of ceramic coatings by producing a solvent mixture of a hydrogen silsesquioxane resin alone or in combination with a metal oxide precursor which is then coated onto the surface of an electronic device. The coating is ceramified at temperatures between about 200° to 1000° C. to form a silicon dioxide-containing ceramic coating. Additional coating layers of ceramic materials are also taught to provide additional protection and coating properties. These additional layers may comprise additional ceramic or ceramic-like coatings containing silicon, silicon and carbon, or silicon, carbon, and nitrogen.

While the techniques taught in the above two Haluska et al patents are effective to provide silicon dioxide-containing ceramic coatings at from about 200° to 1000° C. the ceramification of the hydrogen silsesquioxane resin is quite slow at the lower end of the temperature range so that, for practical production purposes, temperatures of at least 400° C. need to be utilized. Although some electronic devices can withstand these higher temperatures, other devices, such as those containing gallium arsenide components, may not be able to withstand temperatures of 400° C. and above. Additionally, the time period for which the device is exposed to a given temperature may be critical in that short exposure times at a given temperature may be acceptable, while longer exposure times at the same temperature may cause degradation and failure of the electronic device.

Accordingly, there still exists a need in this art for a thin, lightweight ceramic coating and method of application which can be utilized on heat sensitive electronic devices and other heat sensitive substrates. Further, the need still exists for a ceramification procedure which proceeds rapidly at temperatures below about 400° C.

SUMMARY OF THE INVENTION

The present invention meets that need by providing a single or multilayer ceramic or ceramic-like coating which can be applied to heat sensitive substrates such as electronic devices. Further, the present invention provides a process in which the ceramification of the coating proceeds at temperatures as low as about 40° C.

In accordance with one aspect of the present invention a process for the formation of a ceramic or ceramic-like coating on a substrate is provided and includes the steps of coating the substrate with a solution comprising a hydrogen silsesquioxane resin diluted in a solvent and then evaporating the solvent, thereby depositing a preceramic coating on the substrate. The solution containing hydrogen silsesquioxane may be coated onto the substrate by any suitable conventional technique such as by spray coating, dip coating, flow coating, or spin coating. In a preferred embodiment of the invention, the substrate is an electronic device or a silicon wafer.

The preceramic coating is then ceramified to a silicon dioxide-containing ceramic by heating the preceramic coating to a temperature of between about 40° to about 400° C. in the presence of ozone. It has been found that the presence of ozone enhances the rate at which the ceramification proceeds and permits the ceramification of the coating to proceed at lower temperatures than heretofore possible in the art. Ozone can be generated in an electric discharge or by using a source of ultraviolet light in the presence of oxygen. The ultraviolet light should preferably be less than 200 nanometers in wavelength, preferably in the range of 185 to 200 nanometers in wavelength.

The ceramifying step should be carried out in the presence of an atmosphere which contains oxygen as a source of ozone. Air at normal atmospheric pressure is suitable. An enriched oxygen atmosphere or one of pure oxygen may also be utilized, although it is not necessary to do so. It has been further found that the presence of water vapor in the atmosphere also enhances the ceramification. In a preferred embodiment, the ceramification of the coating is carried out in the presence of both ozone and water vapor.

Further, it has been found that the presence of certain metal oxide precursors in the coating solution, alone or in combination with a small amount of platinum catalyst, also enhance the rate of the ceramification at lower temperatures. The metal oxide precursors which are suitable for use in the practice of the present invention include soluble compositions in which the metal in the metal oxide precursor is aluminum, titanium, or zirconium and in which the metal has an alkoxideo ketonate, diketonate, silanolate, or glycolate substituent. The platinum catalyst may optionally be present in the coating solution in an amount of between about 15 to about 200 ppm. Alternatively, the coating solution may contain the platinum catalyst and hydrogen silsesquioxane resin with no additional metal oxide precursors.

The coating layer of ceramified silicon dioxide deposited from the solution containing hydrogen silsesquioxane resin may act as a planarizing layer on the surface of an electronic device. Additional coating layers of ceramic materials may be deposited over the initial layer and act as passivating and/or barrier protective layers. Such additional layers may be deposited using a number of techniques including, but not limited to, chemical vapor deposition, plasma enhanced chemical vapor deposition, metal assisted chemical vapor deposition, thermal, or laser techniques. Another method which may be utilized is to apply a solution of the ceramic precursor material to the surface of the substrate followed by pyrolysis to convert the material to a ceramic. For heat sensitive substrates, the pyrolysis temperature should be kept as low as possible, preferably less than 400° C.

For example, the second layer in a dual layer coating system may comprise a passivating coating selected from the group consisting of a silicon nitrogen-containing coating, a silicon carbon-containing coating, and a silicon carbon nitrogen-containing coating. The silicon nitrogen-containing coating may be applied onto the initial planarizing coating by chemical vapor deposition of a silane, halosilane, halodisilane, halopolysilane or mixture thereof in the presence of ammonial plasma enhanced chemical vapor deposition of a silane, halosilane, halodisilane, halopolysilane or mixtures thereof in the presence of ammonial or ceramification of a silicon and nitrogen-containing ceramic precursor polymer.

The silicon carbon nitrogen-containing coating may be applied onto the planarizing coating by chemical vapor deposition of hexamethyldisilazane; plasma enhanced chemical vapor deposition of hexamethyldisilazane; chemical vapor deposition of a silane halosilane, halodisilane, halopolysilane or mixture thereof in the presence of an alkane of one to six carbon atoms or an alkylsilane, and further in the presence of ammonia; or plasma enhanced chemical vapor deposition of a silane, halosilane, halodisilane, halopolysilane or mixture thereof in the presence of an alkane of one to six carbon atoms or an alkylsilane, and further in the presence of ammonia. The silicon carbon-containing coating may be deposited by chemical vapor deposition of a silane, halosilane, halopolysilane, or mixtures thereof in the presence of an alkane of one to six carbon atoms to produce the passivating coating.

An additional barrier layer to provide the coating system with hermetic properties may be applied over the passivating coating. This barrier coating preferably comprises a silicon-containing coating selected from the group consisting of a silicon coating, a silicon carbon-containing coating, a silicon nitrogen-containing coating, and a silicon carbon nitrogen-containing coating. The silicon coating may be applied onto the passivating coating by chemical vapor deposition of a silane, halosilane, halopolysilane, or mixtures thereof; plasma enhanced chemical vapor deposition of a silane, halosilane, halopolysilane, or mixtures thereof; or metal assisted chemical vapor deposition of a silane, halosilane, halopolysilane, or mixtures thereof. The silicon carbon-containing coating may be applied by chemical vapor deposition of a silane, alkylsilane, halosilane, halodisilane, halopolysilane, or mixtures thereof in the presence of an alkane of one to six carbon atoms or an alkylsilane; or plasma enhanced chemical vapor deposition of a silane, alkylsilane, halosilane, halodisilane, halopolysilane, or mixtures thereof in the presence of an alkane of one to six carbon atoms or an alkylsilane.

The silicon nitrogen-containing coating may be deposited by chemical vapor deposition of a silane, halosilane, halodisilane, halopolysilane or mixtures thereof in the presence of ammonia; plasma enhanced chemical vapor deposition of a silane, halosilane, halodisilane, halopolysilane or mixtures thereof in the presence of ammonia; or ceramification of a silicon and nitrogen-containing preceramic polymer. The silicon carbon nitrogen-containing coating may be deposited by chemical vapor deposition of hexamethyldisilazane; plasma enhanced chemical vapor deposition of hexamethyldisilazane; chemical vapor deposition of a silane, alkylsilane, halosilane, halodisilane, halopolysilane, or mixtures thereof in the presence of an alkane of one to six carbon atoms or an alkylsilane and further in the presence of ammonia; or plasma enhanced chemical vapor deposition of a silane, alkylsilane, halosilane, halodisilane, halopolysilane, or mixtures thereof in the presence of an alkane of one to six carbon atoms or an alkylsilane and further in the presence of ammonia.

Accordingly, it is an object of the present invention to provide a single or multilayer ceramic or ceramic-like coating which can be applied to heat sensitive substrates such as electronic devices. Further, it is an object of the present invention to provide a process in which the ceramification of the hydrogen silsesquioxane coating proceeds at temperatures as low as about 40° C. These, and other objects and advantages of the present invention, will become apparent from the following detailed description and the appended claims.

DETAILED DESCRIPTION OF THE PREFERRED EMBODIMENTS

The present invention relates to the discovery that a silicon dioxide-containing ceramic or ceramic-like coating may be obtained on a substrate at temperatures below those taught by the art by exposing of the preceramic coating to ozone during ceramification. The present invention is particularly useful in providing a protective monolayer or multilayer coating to heat sensitive substrates such as electronic devices and circuits. This is accomplished by coating a hydrogen silsesquioxane resin onto the surface of the substrate and then heating the coating in the presence of ozone to ceramify the coating to a silicon dioxide-containing material. Additional layers of ceramic or ceramic-like materials may then be overcoated to provide additional protection for the substrate.

The coatings of the present invention are useful not only as protective coatings to protect electronic devices from the environment but also as protective layers on other heat sensitive nonmetallic substrates such as plastic materials including, for example, polyimides, epoxides, polytetrafluorethylene and copolymers thereof, polycarbonates acrylics, and polyesters. The coatings may also serve as dielectric layers, doped dielectric layers to produce transistor-like devices, pigment loaded binder systems to produce capacitors and capacitor-like devices, multilayer devices, 3-D devices, silicon-on-insulator (SOI) devices, super lattice devices, and the like.

As used in the present invention, the term "ceramic-like" refers to those pyrolyzed materials which are not fully free of residual carbon and/or hydrogen but which are otherwise ceramic in character. Also, the terms "electronic device" and "electronic circuit" are meant to include, but not be limited to, such devices and circuits as silicon-based devices, gallium arsenide-based devices, focal plane arrays, opto-electronic devices, photovoltaic cells, optical devices, dielectric layers, doped dielectric layers to produce transistor-like devices, pigment loaded binder systems to produce capacitors and capacitor-like devices, multilayer devices, 3-D devices, silicon-on-insulator devices, and super lattice devices.

The present invention is an improvement over the coating processes disclosed and claimed in Haluska et al, U.S. Pat. No. 4,756,977 and Haluska, U.S. Pat. No. 4,753,855, the disclosures of which are hereby incorporated by reference. By exposing the hydrogen silsesquioxane coatings to ozone, the ceramification of the coating or coatings takes place at lower temperatures and/or at faster rates. Thus, the process of the present invention enables ceramification of the coating at temperatures as low as about 40° C. Further, the process of the present invention results in the ceramification proceeding at a significantly faster rate than the prior Haluska et al processes at a given temperature.

In accordance with the present invention, the initial planarizing layer is made up of a hydrogen silsesquioxane resin $(HSiO_{3/2})n$, where n is an integer between 10 and 1,000, and where the resin has a number average molecular weight of from 800 to 2900 and a weight average molecular weight of between 8,000 and 28,000. The resin is diluted with a solvent such as n-heptane or toluene so that the concentration of hydrogen silsesquioxane in solution is from about 0.1 to about 25% by weight. The hydrogen silsesquioxane resin may be prepared in accordance with the teachings of Frye et al, U.S. Pat. No. 3,615,272 and Frye et al, J. Am. Chem. Soc., 92, p.5586 (1970), the disclosures of which are hereby incorporated by reference. When preparing the hydrogen silsesquioxane resins by the reactions described in the disclosures of Frye et al., it is generally preferred to use toluene as a solvent, to operate in a manner that avoids or minimizes elevation of the temperature above ambient conditions, and to neutralize with a mild agent such as calcium carbonate instead of washing to neutrality. The preceramic solvent solution is coated onto a substrate and the solvent allowed to evaporate under ambient conditions. The preceramic coating may be applied by any of a number of convenient techniques including, but not limited to, spin coating, dip coating, spray coating, or flow coating.

By this means, a planarizing preceramic polymer coating is deposited which is then ceramified by exposing the coating to ozone at a temperature of between about 40° to about 400° C. The ozone may be generated conveniently by exposure of oxygen to a source of ultraviolet light. The ultraviolet light source may be any available source which is capable of emitting ultraviolet light in the range of from about 185 to about 200 nanometer wavelength, such as, for example, a quartz-mercury lamp. In this manner, a thin ceramic or ceramic-like planarizing coating is produced on the substrate.

Atmospheres containing oxygen are used during the ceramification of the coating to provide a source of ozone. A normal ambient atmosphere may be used. However, it has been found that enriched oxygen atmospheres or atmospheres of pure oxygen aid in increasing the rate of ceramification. It is believed that the action of the ultraviolet light on the oxygen in the atmosphere breaks the oxygen gas down into atomic oxygen and ozone. The atomic oxygen and ozone then are believed to enhance the oxidation of the hydrogen silsesquioxane during heating to form a silicon dioxide-containing coating at the low temperatures used in the practice of the present invention. Additionally, it has been found that the presence of water vapor in combination with ozone also enhances the rate of ceramification.

Further, the presence of small amounts of platinum catalyst in the coating has also been found to increase the rate of ceramification of the hydrogen silsesquioxane to silicon dioxide. Platinum may be added to the coating solution in the form of an organo-platinum composition and be present in an amount of between about 15 to 200 ppm, based on the weight of the resin in solution. The presence of these small amounts of platinum is believed to catalyze the oxidation of the hydrogen silsesquioxane during heating.

The present invention may also make use of the presence of certain metal oxide precursors in the initial planarizing layer. Thus, the hydrogen silsesquioxane resin may be diluted in solution with zirconium, titanium, and/or aluminum metal oxide precursor compositions that can be converted at low temperatures and relatively rapid reaction rates in the presence of ozone to ceramic or ceramic-like planarizing coatings. The term "metal oxide precursors" is meant to include metal compounds having alkoxy, acyloxy, or other oxygen containing organics group bonded to the metal through the oxygen and capable of being hydrolyzed, and subsequently pyrolyzed, under the ceramification conditions stated herein to produce a metal oxide.

In practice, the hydrogen silsesquioxane resin is diluted in a solvent as described above and mixed with a zirconium, titanium, and/or aluminum metal oxide precursor such as tetra n-propoxy zirconium $(Zr(OCH_2CH_2CH_3)_4)$ or tetra isobutoxy titanium $(Ti[OCH_2CH(CH_3)_2]_4)$. Preferably, the amount of metal oxide precursor added to the solution is such that it provides from about 0.1 to 30% by weight metal oxide in the ceramified coating. The solvent solution is then coated onto a substrate as described above, and the solvent evaporated. The coating is then ceramified in the presence of ozone at a temperature of between about 40° to about 400° C.

In this manner, ceramic or ceramic-like coatings of $SiO_2/ZrO_2$, $SiO_2/TiO_2$, $SiO_2/TiO_2/ZrO_2$, $SiO_2/Al_2O_3$, and the like may be prepared. By varying the mixture of hydrogen silsesquioxane with different metal oxide precursors, ceramic or ceramic-like coatings having varying coefficients of thermal expansion may be produced as taught in the above-mentioned Haluska et al U.S. Pat. No. 4,753,855. This enables the matching of the thermal expansion characteristics of the substrate material with that of the coating so as to minimize the formation of cracks or voids during thermal cycling.

It should be understood that planarizing ceramic coatings can be formed by multiple applications of solutions of hydrogen silsesquioxane resin either prior to the ceramification process or with ceramification prior to each further application of hydrogen silsesquioxane resin. Of course, when multiple applications are used, the ceramic layers may be all the same or may be varied by the inclusion of the other metal oxide precursors in the coating solution. Such a multiple application process may be employed to produce ceramic coatings up to about 2 microns thickness.

The planarizing coating thus produced may then be coated with one or more additional ceramic or ceramic-like coatings which may act as passivating layers, barrier layers to diffusion, abrasion resistant layers, or the like. Such additional coating layers also provide resistance against ionic impurities such as chlorides. They may contain silicon, silicon and carbon, silicon and nitrogen, or silicon, carbon, and nitrogen and may be applied using chemical vapor deposition, plasma enhanced chemical vapor deposition, or other suitable techniques.

Where a silicon and nitrogen containing coating is utilized, preceramic silicon nitrogen-containing polymers suitable for use in the present invention are well known in the art and include silazanes, disilazanes, polysilazanes, and cyclic silazanes. Other suitable materials which may be utilized are described in the above mentioned Haluska et al patents. Such preceramic polymers must be capable of conversion to a ceramic or ceramic-like material or other substrate at temperatures acceptable for the particular electronic device being coated. Generally, such preceramic polymers are most effectively converted to ceramic material at temperatures of about 400° C. and above.

A coating of the preceramic silicon and nitrogen-containing polymer may be applied by first diluting the polymer to a low solids (i.e., 0.1 to 10.0 weight %) solution in an organic solvent such as n-heptane or toluene. The polymer-containing solution is then coated onto the surface of the silicon dioxide-containing planarizing layer using any suitable conventional technique such as spin coating, dip coating, spray coating, or flow coating and the solvent allowed to evaporate. The thus deposited preceramic coating is then ceramified by heating the coating. Thin ceramic or ceramic-like coatings having a thickness of between about 1 to 1500 nanometers may be produced by this method.

Alternatively, chemical vapor deposition, plasma enhanced chemical vapor deposition, and metal assisted chemical vapor deposition techniques may be used to deposit the second and subsequent layers of coatings onto the substrate material. Thus, coatings containing silicon, silicon and carbon, silicon and nitrogen, and silicon, carbon, and nitrogen may be deposited using these techniques. A preferred method of depositing a silicon-containing top layer at a relatively low temperature is by the metal assisted chemical vapor deposition process described in U.S. patent application Ser. No. 835,029, filed Feb. 2, 1986 in the name of Sudarsanan Varaprath and entitled "Silicon-containing Coatings and a Method for Their Preparation". The high temperature conditions of conventional chemical vapor deposition techniques may limit the type of substrates which may be coated. For example, electronic devices which cannot withstand temperatures in excess of 400° C. without damage should be coated using other than conventional chemical vapor deposition techniques such as the metal assisted chemical vapor deposition technique described above.

The practice of the present invention permits the application of ceramic and ceramic-like coatings to substrates which are heat sensitive. For example, some newer electronic devices containing gallium arsenide components are extremely sensitive to heat such that they can only withstand a maximum temperature of about 350° C. for about 30 minutes. Thus, the lower temperatures of the present invention and faster ceramification rates are especially useful in applying protective coatings to such devices.

In order that the invention may be more readily understood, reference is made to the following examples, which are intended to illustrate the invention, but are not to be taken as limiting the scope thereof.

EXAMPLE 1

A preceramic polymer containing hydrogen silsesquioxane resin, $(HSiO_{3/2})n$, produced by the method of Frye et al. above, was diluted in n-heptane solvent to a solids concentration of 0.75% by weight. In addition, 18 ppm platinum based on weight of resin in solution) in the form of bis(diethylthio) platinum dichloride $[(CH_3CH_2)_2S]_2PtCl_2$ was also added to the solution. The solution was then flow coated onto a 38.5 mm × 19.5 mm × 4 mm potassium bromide crystal substrate, and the solvent was allowed to evaporate at room temperature.

The deposited preceramic coating was then ceramified in a reaction chamber under normal ambient atmospheric conditions for a period of approximately 9.5 hours and at a temperature in the range of from 20° C. to 40° C. During the ceramification, the coating was also exposed to ozone using a source of ultraviolet light emitting in the range of from 185 to 366 nanometers to generate the ozone. The UV light source was a quartz mercury vapor lamp model T0606B manufactured by UVOCS Inc., Montgomeryville. Pa.

Infrared spectral analyses were run at 90 minute intervals on the coating at the exposure times indicated in Table I below. Conversion of the hydrogen silsesquioxiane resin to silicon dioxide was measured by the presence and magnitude of a spectral peak at approximately 2245 cm$^{-1}$. The percent conversion was determined by calculating the ratio of the magnitude of the spectral peaks at 2245 cm$^{-1}$. The presence of SiH groups in the composition causes a peak to appear at this wavelength, while the absence of this peak indicates oxidation of all SiH groups to SiO groups. As can be seen, substantially complete ceramification of the coating occurred in approximately 8.0 to 9.5 hours at a maximum temperature of 40° C.

TABLE I

| Exposure Time @ 20° C.–40° C. | % Conversion of $(HSiO_{3/2})n$ to $SiO_2$ |
| --- | --- |
| 0.5 hr. | 18.4 |
| 2.0 | 36.7 |
| 3.5 | 50.0 |
| 5.0 | 64.3 |
| 6.5 | 88.0 |
| 8.0 | 96.9 |
| 9.5 | 100.0 |

By way of comparison, the infrared spectra of a coating of the same composition pyrolyzed at 400° C. but without ozone in normal atmosphere indicated that substantially compete ceramification (i.e., absence of SiH groups in spectra) took approximately 4.25 hr.

EXAMPLE 2

The same preceramic polymer solution as in Example 1, but with 9 ppm of platinum, was flow coated onto a potassium bromide crystal substrate and the solvent allowed to evaporate. The coating was heated to a maximum of 55° C. in a 1 inch tubular reactor over a period of 8 hours while being exposed to ozone generated by a mercury quartz vapor lamp emitting in the ultraviolet wavelength range of 185 to 579 nanometers. Spectral analysis of the coating indicated substantially complete ceramification of the sample in 8 hours as shown by the results reported in Table II below.

TABLE II

| Exposure Time @ 55° C. (max.) | % Conversion of $(HSiO_{3/2})n$ to $SiO_2$ |
| --- | --- |
| 1 hr. | 21.2 |
| 3 | 63.6 |
| 6 | 97.0 |
| 8 | >99.0 |

EXAMPLE 3

The same preceramic polymer solution as in Example 2 was flow coated into a potassium bromide crystal substrate and allowed to evaporate. For comparison purposes, the same preceramic polymer solution but without platinum was flow coated onto a second potassium bromide substrate. The coatings were exposed to ozone generated by an ultraviolet light from a quartz mercury vapor lamp (100 watts, model 7825-30 Ace Glass immersion lamp from Conrad Hanovia) at 200° C. in a reaction chamber. The conversion results are reported in Table III below. As can be seen, the presence of platinum in the coating resulted in a more rapid rate of ceramification.

TABLE III

| | % Conversion of $(HSiO_{3/2})n$ to $SiO_2$ | | |
| --- | --- | --- | --- |
| Sample | 1 hr. | 2 hr. | 3 hr. |
| $(HSiO_{3/2})n$ + Pt | 72.6 | 98.1 | 100.0 |
| $(HSiO_{3/2})n$ | 45.2 | 73.1 | 91.2 |

EXAMPLE 4

The same preceramic polymer as in Examples 3 was flow coated onto a 1 inch square silicon wafer and allowed to air dry for 20 minutes. Additionally, the same preceramic polymer but with the addition of 12 ppm Pt (as $[(C_2H_5)_2S]_2PtCl_2$ (based on the weight of resin) was also flow coated onto a 1 inch square silicon wafer and allowed to air dry for 20 minutes.

The coatings were then heated for 3 one hour periods at 200° C. in air, but without the presence of ozone or any source of ultraviolet light to generate the ozone. Infrared spectra were taken initially and then at each one hour interval to measure the ceramification of the coatings. As can be seen from the date in Table IV below, ceramification in the absence of ozone, as measured by the spectral peaks at 2245 cm$^{-1}$ (conversion of Si—H bonds to Si—O) was negligible, and was considerably slower than for the same resin coatings in the presence of ozone.

TABLE IV

| | % Conversion of $(HSiO_{3/2})n$ to $SiO_2$ | | |
| --- | --- | --- | --- |
| Sample | 1 hr. | 2 hr. | 3 hr. |
| $(HSiO_{3/2})n$ | <10 | <10 | <10 |
| $(HSiO_{3/2})n$ + Pt | <10 | <10 | <10 |

EXAMPLE 5

A first preceramic polymer solution of hydrogen silsesquioxane resin (0.75% by weight solids) was prepared and mixed with $Al(C_5H_7O_2)_3$ (0.75% by weight solids) in a 75/25 mole ratio (i.e., ratio of atoms of Si to atoms of Al) to produce a solution in methyl ethyl ketone. A second preceramic polymer solution of hydrogen silsesquioxane (0.75% by weight solids) was prepared and mixed with $Zr(C_5H_7O_2)_4$ (0.99% by weight solids) in a 75/25 mole ratio (i.e., ratio of atoms of Si to atoms of Zr) to produce a 1% by weight solids solution in methyl ethyl ketone. The second sample also contained 60 ppm platinum (as $Pt(O_2C_5H_7)_2$). Separate potassium bromide crystal substrates were flow coated with each solution. After air drying for 20 minutes, infrared spectra were run. The samples were then subjected to ozone as in Example 3 at 200° C. in a reaction chamber. Infrared spectra were taken periodically, and the results are reported in Table V below.

TABLE V

| | % Conversion of $(HSiO_{3/2})n$ to $SiO_2$ | | |
| --- | --- | --- | --- |
| Sample | 1 hr. | 2 hr. | 3 hr. |
| $(HSiO_{3/2})n/Al(O_2C_5H_7)_3$ | 46.9 | 70.3 | 95.3 |
| $(HSiO_{3/2})n/Zr(O_2C_5H_7)_4$ + Pt | 91.5 | 97.9 | 100.0 |

EXAMPLE 6

The preceramic polymer solutions in methyl ethyl ketone containing hydrogen silsesquioxane resin and mixed with $Al(C_5H_7O_2)_3$ and $Zr(C_5H_7O_2)_4$, respectively, from Example 5 were flow coated onto 1 inch square silicon wafers and allowed to air dry for 20 minutes. For this Example, the $Zr(C_5H_7O_2)_4$ sample contained 12 ppm Pt (as $Pt(O_2C_5H_7)_2$). The coated wafers were heated at 200° C. for 3 one hour intervals in air, but in the absence of ozone or a source of ultraviolet light, Infrared spectra were taken at one hour intervals, As can be seen from the data in Table VI below, ceramification in the absence of ozone, as measured by the spectral peaks at 2245 cm$^{-1}$ (conversion of Si—H bonds to Si—O) was neglaigible, and was considerably slower than for the same resin coatings in the presence of ozone (see Example 5).

TABLE VI

| | % Conversion of $(HSiO_{3/2})n$ to $SiO_2$ | | |
| --- | --- | --- | --- |
| Sample | 1 hr. | 2 hr. | 3 hr. |
| $(HSiO_{3/2})n/Al(O_2C_5H_7)_3$ | <10 | <10 | <10 |
| $(HSiO_{3/2})n/Zr(O_2C_5H_7)_4$ + Pt | 15 | 25 | 40 |

EXAMPLE 7

A preceramic polymer solution of hydrogen silsesquioxane resin was prepared and diluted to a 10% by weight solids solution in n-heptane. 173 ppm platinum (as Pt $(O_2C_5H_7)_2$) was also added to the solution. The solution was applied to a 1 inch square silicon wafer and a GaAs gigabit Logic 10G001-4F device by spin coating the solution on the parts at 3000 rpm for 10 seconds. The coatings were dried in air and then heated at 300° C. in air while exposed to ozone generated by a UV light from a mercury quartz vapor lamp as in previous examples. The GaAs device was operable after ceramification of the coating. Infrared spectral analyses of the conversion of the coatings are reported in Table VII below.

TABLE VII

| Sample | % Conversion of $(HSiO_{3/2})n$ to $SiO_2$ 1 hr. |
|---|---|
| $(HSiO_{3/2})_n$ + Pt | >90% |

EXAMPLE 8

The same preceramic polymer solution as in Example 5 was prepared and spin coated into a 1 inch square silicon wafer and the same type of GaAs device at 3000 rpm for 70 seconds. The coatings were dried in air and then heated at 300° C. in an oxygen atmosphere saturated with water vapor ($O_2$ bubbled through $H_2$) while exposed to ozone as in Example 5. The GaAs device was operable after ceramification of the coating. Infrared spectral analyses of the conversion of the coatings are reported in Table VIII below. As can be seen, the ceramification proceeds more quickly in the presence of an oxygen atmosphere and water vapor.

TABLE VIII

| Sample | % Conversion of $(HSiO_{3/2})n$ to $SiO_2$ 1 hr. |
|---|---|
| $(HSiO_{3/2})_n$ + Pt | 100% |

A one inch square silicon wafer was flow coated with a preceramic polymer solution of 0.8 weight % (HSiO)$_{3/2})_n$ and 0.85 weight % $Ti(OC_4H_9)_4$ with 12 ppm Pt (as $Pt(O_2C_5H_7)_2$) in n-heptane and then allowed to air dry for 20 minutes. A Motorola 14011B CMOS device was spin coated with the preceramic polymer solution at 2000 rpm for a period of 15 seconds. A 1.5×2.0 inch polyimide circuit board (thermal stability 280° C.) was also spin coated with the same solution at 2000 rpm for 15 seconds. Both were allowed to air dry for about 20 minutes.

All of the coated parts were heated for 3 one hour intervals at 200° C. in air while exposed to ozone generated by a UV light from a mercury quartz vapor lamp as in previous examples. Infrared spectra were run on the samples prior to heating and at each one hour interval. The change in Si—H absorption at 2245 cm$^{-1}$ indicated that a substantial conversion to Si—O had occurred after 3 hours (at least 70% conversion) in each instance.

By way of comparison, the same preceramic polymer solution was flow coated onto a one inch square silicon wafer, air dried for 20 minutes, and then heated in air at 200° C. for 3 one hour intervals. Infrared spectra were run initially prior to heating and at each one hour interval. The spectral data indicated that the conversion of Si—H bonds to Si—O was slower than compared to samples which had been exposed to ozone.

While certain representative embodiments and details have been shown for purposes of illustrating the invention, it will be apparent to those skilled in the art that various changes in the methods and apparatus disclosed herein may be made without departing from the scope of the invention, which is defined in the appended claims.

What is claimed is:

1. A process for the formation of a ceramic or ceramic-like coating on a substrate comprising the steps of:
   (a) coating said substrate with a solution comprising a hydrogen silsesquioxane resin diluted in a solvent;
   (b) evaporating said solvent to thereby deposit a preceramic coating on said substrate; and
   (c) ceramifying said preceramic coating to a silicon dioxide-containing ceramic by heating said preceramic coating to a temperature of between about 40° to about 400° C. in the presence of ozone.

2. The process of claim 1 in which said ozone is generated by a source of ultraviolet light.

3. The process of claim 1 in which said ozone is generated by a source of electric discharge.

4. The process of claim 1 in which said ceramifying step is carried out in the presence of water vapor.

5. The process of claim 2 in which said source of ultraviolet light emits in the range of 185 to 200 nanometers.

6. The process of claim 1 in which said solution also contains a soluble metal oxide precursor in which the metal in said metal oxide precursor is aluminum, titanium, or zirconium and in which the metal has an alkoxide, ketonate, diketonate, silanolate, or glycolate substituent.

7. The process of claim 1 in which said solution also contains platinum.

8. The process of claim 7 in which said platinum is present in an amount of between about 15 to about 200 ppm, based on the weight of said resin.

9. The process of claim 6 in which said solution also contains platinum.

10. The process of claim 1 in which said solution containing hydrogen silsesquioxane is coated onto said substrate by spray coating, dip coating, flow coating, or spin coating.

11. The process of claim 1 in which said substrate is an electronic device.

12. The process of claim 1 in which said substrate is a silicon wafer.

13. A process for the formation of a multilayer ceramic or ceramic-like coating on a substrate comprising the steps of:
   (I)
   (a) coating said substrate with a planarizing coating comprising a solution of a hydrogen silsesquioxane resin diluted in a solvent;
   (b) evaporating said solvent to thereby deposit a preceramic coating on said substrate; and
   (c) ceramifying said preceramic coating to a silicon dioxide-containing ceramic by heating said preceramic coating to a temperature of between about 40° to about 400° C. in the presence of ozone to form said planarizing coating;
   (II) applying to said planarizing coating a passivating coating selected from the group consisting of (i) a silicon nitrogen-containing coating, (ii) a silicon carbon-containing coating, and (iii) a silicon carbon nitrogen-containing coating; and
   (III) applying to said passivating coating a silicon-containing coating selected from the group consisting of (i) a silicon coating, (ii) a silicon carbon-containing coating, (iii) a silicon nitrogen-containing coating, and (iv) a silicon carbon nitrogen-containing coating, whereby a multilayer ceramic or ceramic-like coating is obtained.

14. The process of claim 13 wherein in said passivating coating said silicon nitrogen-containing coating is applied onto said planarizing coating by a means selected from the group consisting of (a) chemical vapor deposition of a silane, halosilane, halodisilane, halopolysilane or mixtures thereof in the presence of ammonia, (b) plasma enhanced chemical vapor deposition of a silane, halosilane, halodisilane, halopolysilane or mixtures thereof in the presence of ammonia, (c) ceramification of a silicon and nitrogen-containing polymer; and wherein said silicon carbon nitrogen-containing coating is applied onto said planarizing coating by a means selected from the group consisting of (1) chemical vapor deposition of hexamethyldisilazane, (2) plasma enhanced chemical vapor deposition of hexamethyldisilazane, (3) chemical vapor deposition of a silane, halosilane, halodisilane, halopolysilane or mixture thereof in the presence of an alkane of one to six carbon atoms or an alkylsilane, and further in the presence of ammonia, and (4) plasma enhanced chemical vapor deposition of a silane, halosilane, halodisilane, halopolysilane or mixture thereof in the presence of an alkane of one to six carbon atoms or an alkylsilane, and further in the presence of ammonia; and wherein the silicon carbon-containing coating is deposited by a means selected from the group consisting of (i) chemical vapor deposition of a silane, halosilane, halopolysilane, or mixtures thereof in the presence of an alkane of one to six carbon atoms, to produce said passivating coating.

15. The process of claim 13 wherein in said silicon-containing coating, the silicon coating is applied onto said passivating coating by a means selected from the group consisting of (a) chemical vapor deposition of a silane, halosilane, halopolysilane, or mixtures thereof, (b) plasma enhanced chemical vapor deposition of a silane, halosilane, halopolysilane, or mixtures thereof, or (c) metal assisted chemical vapor deposition of a silane, halosilane, halopolysilane, or mixtures thereof; and wherein the silicon carbon-containing coating is applied by a means selected from the group consisting of (1) chemical vapor deposition of a silane, alkylsilane, halosilane, halodisilane, halopolysilane, or mixtures thereof in the presence of an alkane of one to six carbon atoms or an alkylsilane, (2) plasma enhanced chemical vapor deposition of a silane, alkylsilane, halosilane, halodisilane, halopolysilane, or mixtures thereof in the presence of an alkane of one to six carbon atoms or an alkylsilane; and wherein the silicon nitrogen-containing coating is deposited by a means selected from the group consisting of (A) chemical vapor deposition of a silane, halosilane, halodisilane, halopolysilane or mixtures thereof in the presence of ammonia, (B) plasma enhanced chemical vapor deposition of a silane, halosilane, halodisilane, halopolysilane or mixtures thereof in the presence of ammonia, and (C) ceramification of a silicon and nitrogen-containing preceramic polymer; and wherein the silicon carbon nitrogen-containing coating is deposited by a means selected from the group consisting of (i) chemical vapor deposition of hexamethyldisilazane, (ii) plasma enhanced chemical vapor deposition of hexamethyldisilazane, (iii) chemical vapor deposition of a silane, alkylsilane, halosilane, halodisilane, halopolysilane, or mixtures thereof in the presence of an alkane of one to six carbon atoms or an alkylsilane and further in the presence of ammonia, and (iv) plasma enhanced chemical vapor deposition of a silane, alkylsilane, halosilane, halodisilane, halopolysilane, or mixtures thereof in the presence of an alkane of one to six carbon atoms or an alkylsilane and further in the presence of ammonia, to produce said silicon-containing coating.

16. The process of claim 13 in which said ozone is generated by a source of ultraviolet light.

17. The process of claim 13 in which said ozone is generated by a source of electric discharge.

18. The process of claim 13 in which said ceramifying step is carried out in the presence of water vapor.

19. The process of claim 16 in which said source of ultraviolet light emits in the range of 185 to 200 nanometers.

20. The process of claim 13 in which said solution also contains a soluble metal oxide precursor in which the metal in said metal oxide precursor is aluminum, titanium, or zirconium and in which the metal has an alkoxide, ketonate, diketonate, silanolate, or glycolate substituent.

21. The process of claim 13 in which said solution also contains platinum.

22. The process of claim 21 in which said platinum is present in an amount of between about 15 to about 200 ppm, based on the weight of said resin.

23. The process of claim 20 in which said solution also contains platinum.

24. The process of claim 13 in which said solution containing hydrogen silsesquioxane resin is coated onto said substrate by spray coating, dip coating, flow coating, or spin coating.

25. The process of claim 13 in which said substrate is an electronic device.

26. The process of claim 13 in which said substrate is a silicon wafer.

27. A process for the formation of a dual layer ceramic or ceramic-like coating on a substrate comprising the steps of:
(I)
(a) coating said substrate with a planarizing coating comprising a solution of a hydrogen silsesquioxane resin diluted in a solvent;
(b) evaporating said solvent to thereby deposit a preceramic coating on said substrate; and
(c) ceramifying said preceramic coating to a silicon dioxide-containing ceramic by heating said preceramic coating to a temperature of between about 40° to about 400° C. in the presence of ozone to form said planarizing coating; and
(II) applying to said planarizing coating a passivating coating selected from the group consisting of (i) a silicon nitrogen-containing coating, (ii) a silicon carbon-containing coating, and (iii) a silicon carbon nitrogen-containing coating, whereby a dual layer ceramic or ceramic-like coating is obtained.

28. The process of claim 27 wherein in said passivating coating said silicon nitrogen-containing coating is applied onto said planarizing coating by a means selected from the group consisting of (a) chemical vapor deposition of a silane, halosilane, halodisilane, halopolysilane or mixtures thereof in the presence of ammonia, (b) plasma enhanced chemical vapor deposition of a silane, halosilane, halodisilane, halopolysilane or mixtures thereof in the presence of ammonia, (c) ceramification of a silicon and nitrogen-containing polymer; and wherein said silicon carbon nitrogen-containing coating is applied onto said planarizing coating by a means selected from the group consisting of (1) chemical vapor deposition of hexamethyldisilazane, (2) plasma enhanced chemical vapor deposition of hexamethyldisilazane, (3) chemical vapor deposition of a silane, halosilane, halodisilane, halopolysilane or mixture thereof in the presence of an alkane of one to six carbon atoms or an alkylsilane, and further in the presence of ammonia, and (4) plasma enhanced chemical vapor deposition of a silane, halosilane, halodisilane, halopolysilane or mixture thereof in the presence of an alkane of one to six carbon atoms or an alkylsilane, and further in the presence of ammonia; and wherein the silicon carbon-containing coating is deposited by a means selected from the group consisting of (i) chemical vapor deposition of a silane, halosilane, halopolysilane, or mixtures thereof in the presence of an alkane of one to six carbon atoms, to produce said passivating coating.

29. The process of claim 27 in which said ozone is generated by a source of ultraviolet light.

30. The process of claim 27 in which said ozone is generated by a source of electric discharge.

31. The process of claim 27 in which said ceramifying step is carried out in the presence of water vapor.

32. The process of claim 29 in which said source of ultraviolet light emits in the range of 185 to 200 nanometers.

33. The process of claim 25 in which said solution also contains a soluble metal oxide precursor in which the metal in said metal oxide precursor is aluminum, titanium, or zirconium and in which the metal has an alkoxide, ketonate, diketonate, silanolate, or glycolate substituent.

34. The process of claim 25 in which said solution also contains platinum.

35. The process of claim 34 in which said platinum is present in an amount of between about 15 to about 200 ppm, based on the weight of said resin.

36. The process of claim 33 in which said solution also contains platinum.

37. The process of claim 27 in which said solution containing hydrogen silsesquioxane resin is coated onto said substrate by spray coating, dip coating, flow coating, or spin coating.

38. The process of claim 27 in which said substrate is an electronic device.

39. The process of claim 27 in which said substrate is a silicon wafer.

* * * * *